US012217700B2

(12) United States Patent
Kim et al.

(10) Patent No.: US 12,217,700 B2
(45) Date of Patent: Feb. 4, 2025

(54) DISPLAY APPARATUS

(71) Applicant: LG Display Co., Ltd., Seoul (KR)

(72) Inventors: Donghyun Kim, Paju-si (KR); Dongjun Kim, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/513,705

(22) Filed: Nov. 20, 2023

(65) Prior Publication Data

US 2024/0096287 A1 Mar. 21, 2024

Related U.S. Application Data

(63) Continuation of application No. 18/078,684, filed on Dec. 9, 2022, now Pat. No. 11,862,107, which is a continuation of application No. 17/549,245, filed on Dec. 13, 2021, now Pat. No. 11,557,256.

(30) Foreign Application Priority Data

Dec. 24, 2020 (KR) .................. 10-2020-0183514

(51) Int. Cl.
G09G 3/3266 (2016.01)
(52) U.S. Cl.
CPC ... G09G 3/3266 (2013.01); *G09G 2300/0408* (2013.01); *G09G 2310/08* (2013.01)
(58) Field of Classification Search
None
See application file for complete search history.

(56) References Cited

U.S. PATENT DOCUMENTS

| 2015/0109276 | A1 | 4/2015 | Gupta et al. |
| 2015/0185956 | A1* | 7/2015 | Takayama ........... G06F 3/04166 345/174 |
| 2016/0104409 | A1 | 4/2016 | Jeon et al. |
| 2017/0018245 | A1 | 1/2017 | Park et al. |
| 2017/0092198 | A1 | 3/2017 | Ryu et al. |
| 2019/0058029 | A1 | 2/2019 | Woo et al. |
| 2019/0130847 | A1* | 5/2019 | Um ..................... G09G 3/3266 |
| 2020/0211475 | A1 | 7/2020 | Park et al. |

FOREIGN PATENT DOCUMENTS

| CN | 106228937 A | 12/2016 |
| CN | 108109583 A | 6/2018 |
| CN | 108877724 A | 11/2018 |
| CN | 109712563 A | 5/2019 |
| CN | 110675816 A | 1/2020 |

(Continued)

OTHER PUBLICATIONS

Japanese Office Action dated Mar. 5, 2024 issued in Patent Application No. 2023-101774 w/English Translation (8 pages).

(Continued)

*Primary Examiner* — Christopher J Kohlman
(74) *Attorney, Agent, or Firm* — Fish & Richardson P.C.

(57) ABSTRACT

A display apparatus includes an active area, an inactive area surrounding the active area, a pixel disposed in the active area, and a driver IC, a gate driver, a low-potential power supply line, a high-potential power supply line and a subframe controller disposed in the inactive area, wherein the subframe controller is disposed between the pixel and the gate driver.

17 Claims, 7 Drawing Sheets

(56) References Cited

FOREIGN PATENT DOCUMENTS

| | | |
|---|---|---|
| CN | 110827756 A | 2/2020 |
| CN | 111179849 A | 5/2020 |
| CN | 111402800 A | 7/2020 |
| CN | 111968574 A | 11/2020 |
| CN | 112102785 A | 12/2020 |
| JP | 2007-025710 A | 2/2007 |
| JP | 2008-282030 A | 11/2008 |
| JP | 2014-215613 A | 11/2014 |
| JP | 2018-106057 A | 7/2018 |
| JP | 2019-074560 A | 5/2019 |
| JP | 2020-021072 A | 2/2020 |
| KR | 10-2019-0108667 A | 9/2019 |
| KR | 10-2020-0130546 A | 11/2020 |
| WO | 2013-098899 A1 | 7/2013 |

OTHER PUBLICATIONS

Chinese Office Action dated Jan. 4, 2023 issued in Patent Application No. 202111566316.3 w/English Translation (23 pages).
Japanese Notice of Allowance dated May 23, 2023 issued in Patent Application No. 2021-205578 w/English Translation (5 pages).
Japanese Office Action dated Nov. 29, 2022 issued in Patent Application No. 2021-205578 w/English Translation (9 pages).

* cited by examiner

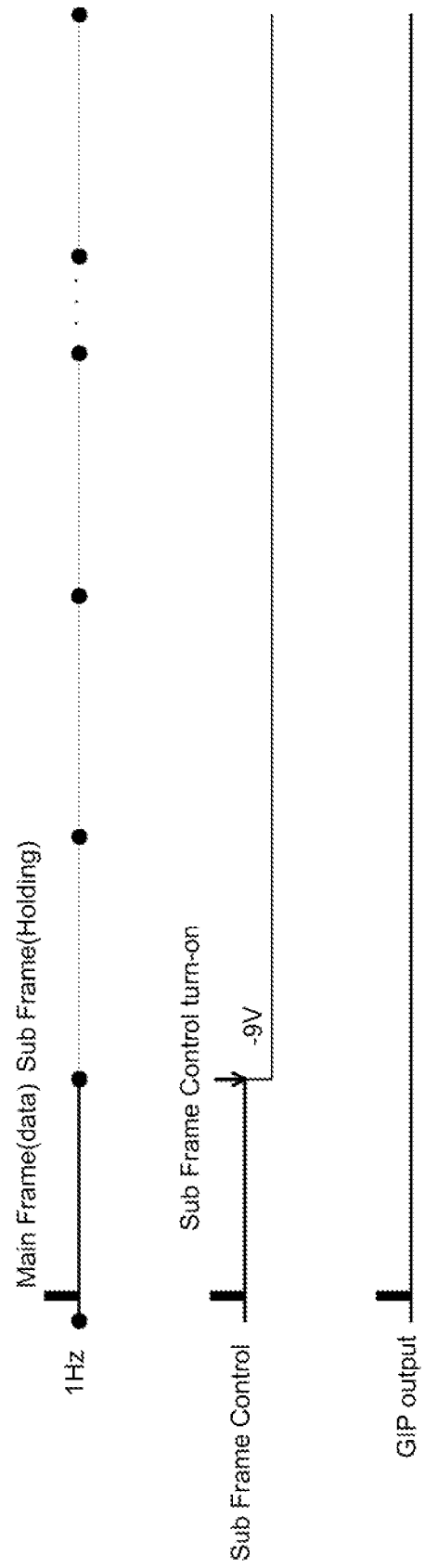

DISPLAY APPARATUS

CROSS-REFERENCE TO RELATED APPLICATIONS

This application is a continuation of U.S. patent application Ser. No. 18/078,684, filed on Dec. 9, 2022, which is a continuation of U.S. patent application Ser. No. 17/549,245, filed on Dec. 13, 2021, Now U.S. Pat. No. 11,557,256, issued on Jan. 17, 2023, which claims the priority of Korean Patent Application No. 10-2020-0183514 filed on Dec. 24, 2020, which are hereby incorporated by reference in their entirety for all purposes as if fully set forth herein.

BACKGROUND

Field of the Disclosure

The present disclosure relates to a gate driving circuit and a display apparatus using the same, and more particularly, to a display apparatus that includes an additional transistor connected to a gate driving circuit to suppress an unintended increase in output current.

Description of the Background

Recently, as the society enters an information society, a display field which visually represents an electrical information signal is rapidly being developed. In accordance with the rapid development, various display apparatuses having excellent performance such as thin thickness, light weight, and low power consumption properties have been developed.

Specific examples of the above-mentioned display apparatus may include a liquid crystal display apparatus (LCD), an organic light emitting diode (OLED) display apparatus, a quantum dot display apparatus, and the like.

A display apparatus includes a pixel array that displays an image and a panel driving circuit that drives signal lines of the pixel array. The panel driving circuit includes a data driving circuit that supplies data signals to data lines of the pixel array. The panel driving circuit also includes a gate driving circuit (or a scan driving circuit) that sequentially supplies gate pulses (or scan pulses) synchronized with the data signals to gate lines (or scan lines) of the pixel array. The panel driving circuit further includes a timing controller that controls the data driving circuit and the gate driving circuit.

Recently, a technique of installing the gate driving circuit with the pixel array in a display panel has been applied. The gate driving circuit installed in the display panel is known as "Gate In Panel (GIP) circuit". The GIP circuit includes a shift register formed in a bezel area. The shift register includes a plurality of GIP elements connected in a cascade manner. The GIP elements generate gate outputs in response to start pulses or carry signals and shift the gate outputs according to a shift clock. Therefore, a start pulse, a shift clock, a driving voltage, and the like are supplied to the shift register.

Recently, a further developed technique enables a low-temperature polycrystalline silicon (LTPS) transistor and an oxide transistor to be used as a driving transistor and a switching transistor, respectively, to improve efficiency in low-speed (Hz) driving. When two different types of transistors are used together, power consumption may be remarkably reduced during driving. However, in a high temperature environment, current leakage occurs from the transistors. Thus, an output voltage output from a gate driver to a pixel may increase.

Such an abnormal increase in output voltage may cause abnormal display during low-speed driving of the oxide transistor. To solve the above-described problem, various methods for reducing an inactive area of a freeform display panel including a gate driver therein have been recently proposed.

SUMMARY

Accordingly, the present disclosure is to provide a display apparatus including a gate driver therein and configured to suppress an abnormal increase in output voltage from a transistor caused by a stress in a high temperature environment.

According to an aspect of the present disclosure, the display apparatus includes: an active area; an inactive area surrounding the active area; and a pixel disposed in the active area. The inactive area includes: a driver IC, a gate driver, a low-potential power line, a high-potential power line and a subframe controller. The subframe controller may be disposed between the pixel and the gate driver.

According to another aspect of the present disclosure, the display apparatus includes: an active area; an inactive area surrounding the active area; a pixel disposed in the active area; and a driver IC, a gate driver, a low-potential power line, a high-potential power line and a subframe controller disposed in the inactive area, wherein the gate driver is driven in a low-speed driving mode.

Other detailed matters of the exemplary aspects are included in the detailed description and the drawings.

According to the present disclosure, a display apparatus includes a separate controller at an output terminal of a gate driver to minimize an increase in gate output caused by low-speed driving. Thus, a pixel in an active area may be driven normally.

According to the present disclosure, in the display apparatus, a subframe controller is turned on when an output from the gate driver where an oxide semiconductor is disposed for 1 Hz low-speed driving increases. Thus, a gate low signal from the gate driver may be output to the gate output terminal to minimize the increase in output.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIG. 4B is a conceptual diagram illustrating a low-speed frame configuration of a gate driver according to the exemplary aspect shown in FIG. 4A and a change in output from the gate driver at that time.

DETAILED DESCRIPTION

Figure 1:
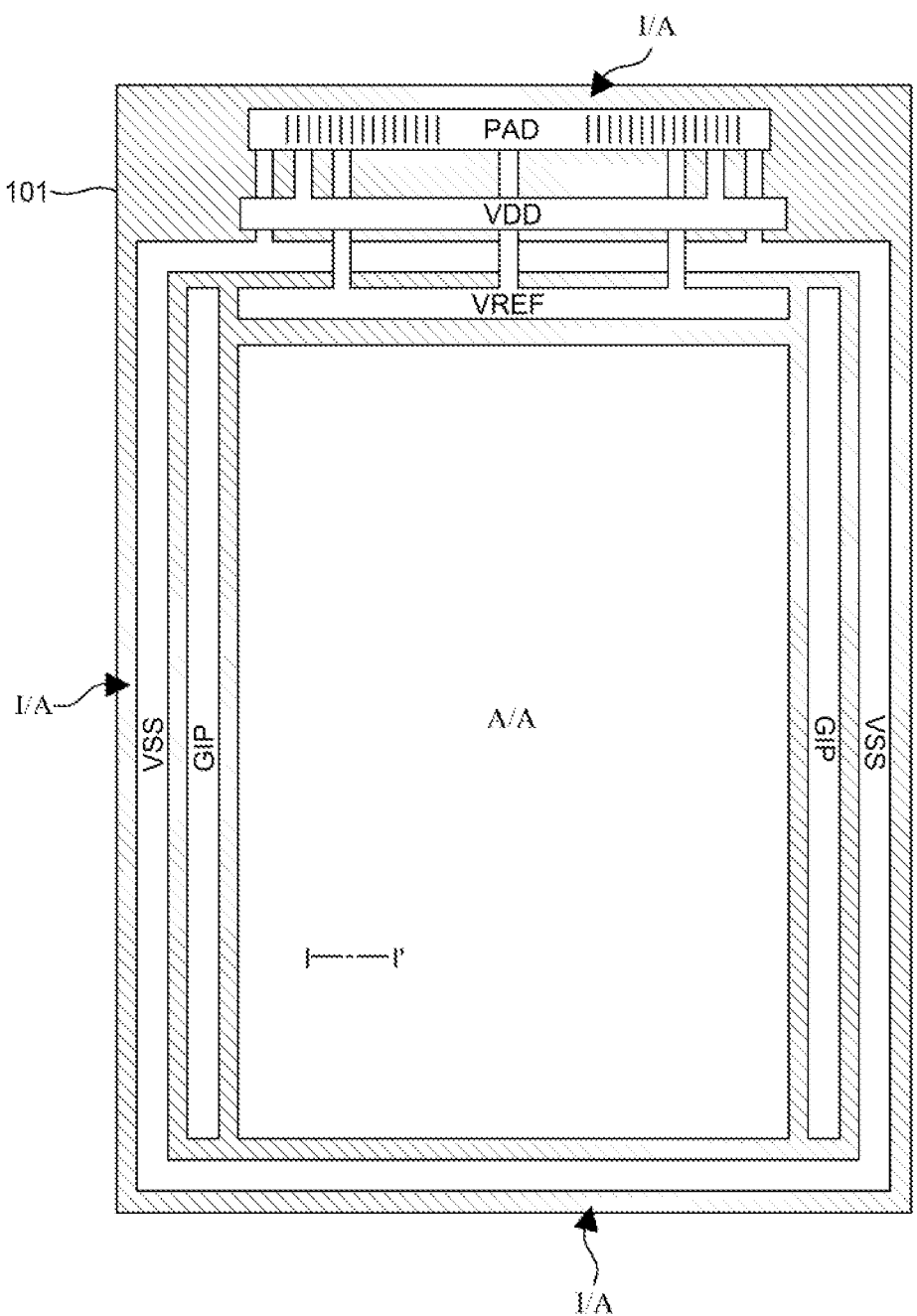
FIG. 1 shows the entire surface of a display panel according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be disposed directly on the another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

In the present disclosure, a display apparatus may include a liquid crystal module (LCM) including a display panel and a driver for driving the display panel, an organic light emitting diode display module (OLED module), and a quantum dot module (QD module). In addition, the display apparatus may also include equipment display apparatus including complete product or final product of LCM, OLED or QD module, for example, notebook computer, television, computer monitor, automotive display apparatus, or other vehicle display apparatuses, and set electronic devices or set device (set apparatus) such as mobile electronic devices of smart phone or electronic pad.

Accordingly, the display apparatus according to the present disclosure may include application products or set apparatuses such as final products including the LCM, OLED or QD module as well as display apparatuses such as LCM, OLED or QD module.

If needed, the LCM, OLED or QD module configured as the display panel, the driver, and the like may be expressed as the "display apparatus", and the electronic device of the final product including the LCM, OLED or QD module may be expressed as the "set apparatus". For example, the display apparatus may include a display panel of LCD, OLED or QD, and a source printed circuit board (source PCB) as a controller for driving the display panel. Meanwhile, the set apparatus may further include a set PCB as a set controller, which is electrically connected to the source PCB, to control the entire set apparatus.

The display panel used for the present exemplary aspect may be all types of display panels, for example, a liquid crystal display panel, an organic light emitting diode OLED display panel, a quantum dot QD display panel, an electroluminescent display panel, and the like. The display panel is not limited to a particular display panel including a flexible substrate for an OLED display panel and a backplate support structure disposed beneath the display panel, thereby being capable of achieving bezel bending. The display panel used in the display apparatus according to an exemplary aspect of the present disclosure is not limited in shape and size.

More specifically, when the display panel is an OLED display panel, the display panel may include a plurality of gate lines, a plurality of data lines, and a plurality of pixels PXL (see FIG. 4A) provided in respective intersections between the gate lines and the data lines. In addition, the display panel may further include an array including thin film transistors as elements for selectively applying a voltage to each of the pixels, an OLED layer disposed on the array, and an encapsulation substrate or an encapsulation layer disposed on the array to cover the OLED layer. The encapsulation layer protects the thin film transistors and the OLED layer from external impact and suppresses the permeation of moisture or oxygen into the OLED layer. Layers formed on the array may include an inorganic light emitting layer, for example, a nano-sized material layer or a quantum dot layer, and the like.

In the present disclosure, FIG. 1 illustrates an exemplary OLED display panel which may be integrated into display apparatuses.

FIG. 1 is a plan view illustrating an exemplary display apparatus which may be included in an electronic device.

Referring to FIG. 1, a display apparatus 100 includes at least one active area in which an array of pixels is formed. One or more inactive areas may be disposed around the active area. That is, the inactive areas may be disposed at one or more side surfaces of the active area. In FIG. 1, the inactive areas surround the active area having a rectangular shape. However, the shape of the active area and the shape/placement of the inactive areas adjacent to the active area are not limited to the example shown in FIG. 1. The active area and the inactive area may be in any shape suitable for the design of the electronic device employing the display apparatus 100. The shape of the active area may be, for example, a pentagonal shape, a hexagonal shape, a circular shape, an oval shape, and the like.

Each pixel in the active area may be associated with a pixel circuit. The pixel circuit may include one or more switching transistors and one or more driving transistors on a substrate 101. Each pixel circuit may be electrically connected to a gate line and a data line to communicate with one or more driving circuits, such as a gate driver and a data driver located in the inactive area. Each pixel may include an organic light emitting diode.

Each driving circuit may be implemented with a thin film transistor (TFT) in the inactive area as shown in FIG. 1. Such a driving circuit may be referred to as a gate driver which is a gate-in panel (GIP). Also, some of the components, such as data driver-IC, may be mounted on a separate printed circuit board. Also, they may be coupled to a connection interface (pad/bump, pin, etc.) disposed in the inactive area using a circuit film such as flexible printed circuit board (FPCB), chip-on-film (COF), tape-carrier-package (TCP), or the like. The inactive area may be bent together with the connection interface so that the printed circuit (COF, PCB, etc.) may be located on the back side of the display apparatus 100.

The display apparatus 100 may further include a power controller that supplies various voltages or currents to the pixel circuit, the data driver, the GIP, etc. or controls the supply. The power controller may also be referred to as "power management IC (PMIC)". Also, the display apparatus 100 may include a voltage line for supplying high-potential power VDD (i.e., high potential power line), a voltage line for supplying low-potential power VSS (i.e., low potential power line) and a voltage line for supplying reference voltage VREF, respectively, related to driving of the pixel circuit as shown in FIG. 1.

With a decrease in size of the display apparatus 100, an oxide semiconductor advantageous for low-speed driving efficient in power consumption may be applied to the GIP. The oxide semiconductor is not limited to the GIP, but may be used as a transistor for driving a pixel in the active area. Driving at a scanning rate of less than 60 Hz may be referred to as low-speed driving, and specifically, the scanning rate may be in the range of from 1 Hz to 5 Hz. Driving at a scanning rate of 60 Hz or more in the range of from 120 Hz to 240 Hz may be referred to as high-speed driving.

Meanwhile, the display apparatus 100 may further include various additional components for generating various signals or driving organic light emitting diodes in the active area. The additional components for driving the organic light emitting diodes may include an inverter circuit, a multiplexer, an electro static discharge circuit and the like. The display apparatus 100 may also include additional components associated with functionalities other than for driving the organic light emitting diodes. For example, the display apparatus 100 may include additional components for providing a touch sensing functionality, a user authentication functionality (e.g., fingerprint scan), a multi-level pressure sensing functionality, a tactile feedback functionality and the like.

The above-described additional components may be located in an external circuit connected to the inactive area and/or the connection interface.

The voltage line for supplying low-potential power VSS may be disposed on an outer inactive area I/A of the display apparatus 100 to surround an active area A/A. This is to easily supply low-potential power to cathode electrodes of all the organic light emitting diodes disposed in the active area A/A with a minimized electric resistance in a shortest distance.

Figure 2:
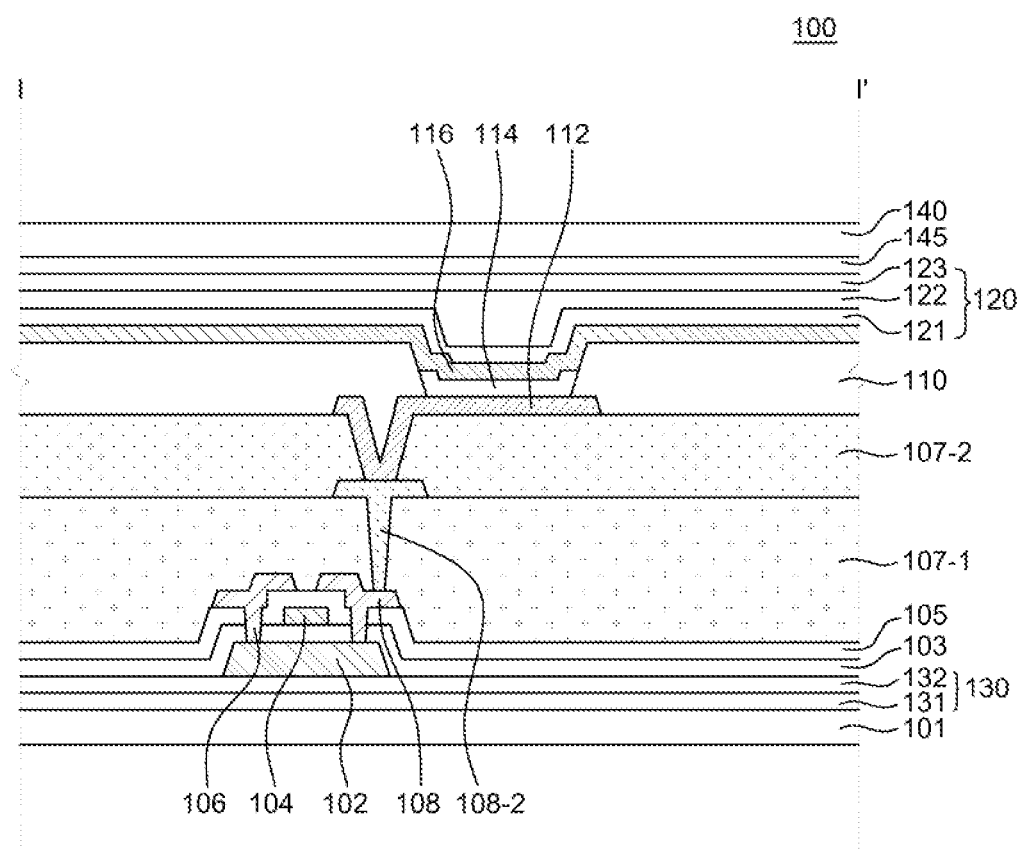
FIG. 2 is a cross-sectional view of an active area as taken along line I-I' of FIG. 1.

FIG. 2 is a cross-sectional view of the active area A/A of the display apparatus as taken along a line I-I'. In the display apparatus 100, thin film transistors 102, 103, 104, 105, 106, and 108, organic light emitting diodes 112, 114, and 116, and various functional layers are located on the substrate 101.

The substrate 101 may be a glass or plastic substrate. If the substrate 101 is a plastic substrate, the substrate 101 may be made of polyimide-based or polycarbonate-based material and thus may have flexibility. In particular, polyimide may be processed under a high temperature and may be coated, and thus is widely used for a plastic substrate.

A buffer layer 130 is a functional layer for protecting the electrodes and lines from impurities such as alkali ions or the like coming out from the substrate 101 or lower layers. The buffer layer 130 may be made of silicon oxide SiOx, silicon nitride SiNx, or a multilayer thereof. The buffer layer 130 may include a multi-buffer 131 and/or an active buffer 132. The multi-buffer 131 may be formed by alternately laminating silicon nitride (SiNx) and silicon oxide (SiOx), and may delay diffusion of moisture and/or oxygen permeating into the substrate 101. The active buffer 132 protects a semiconductor layer 102 of the transistor and functions to block various kinds of defects introduced from the substrate 101. The active buffer 132 may be made of amorphous silicon a-Si, or the like.

The thin film transistor may have a structure in which the semiconductor layer 102, a gate insulating layer 103, a gate electrode 104, an interlayer insulating layer 105, and source and drain electrodes 106 and 108 are sequentially disposed. The semiconductor layer 102 is located on the buffer layer 130. The semiconductor layer 102 may be made of polysilicon p-Si. In this case, a predetermined region may be doped with an impurity. In addition, the semiconductor layer 102 may be made of amorphous silicon a-Si, or may be made of various organic semiconductor materials such as pentacene. Further, the semiconductor layer 102 may be made of an oxide. The gate insulating layer 103 may be made of an insulating inorganic material, such as silicon oxide SiOx or silicon nitride (SiNx), or may also be made of an insulating organic material or the like. The gate electrode 104 may be made of various conductive materials such as magnesium (Mg), aluminum (Al), nickel (Ni), chromium (Cr), molybdenum (Mo), tungsten (W), gold (Au) or an alloy thereof.

The interlayer insulating layer 105 may be made of an insulating material, such as silicon oxide SiOx or silicon nitride SiNx, or may also be made of an insulating organic material or the like. A contact hole may be formed by selectively removing portions of the interlayer insulating layer 105 and the gate insulating layer 103 to expose source and drain regions.

The source and drain electrodes 106 and 108 are formed as a single-layered or a multi-layered structure with an electrode material on the interlayer insulating layer 105. If needed, a passivation layer made of an inorganic insulating material may cover the source and drain electrodes 106 and 108.

A first planarization layer 107-1 may be located on the thin film transistor. The first planarization layer 107-1 protects the thin film transistor and the like and flattens an upper portion thereof. The first planarization layer 107-1 may have various shapes. The first planarization layer 107-1 may be made of one or more of acrylic-based resin, epoxy resin, phenol resin, polyamide-based resin, polyimide-based resin, unsaturated polyester-based resin, polyphenylene-based resin, and polyphenylene sulfide-based resin, but is not limited thereto.

Various metal layers serving as lines and electrodes may be disposed on the first planarization layer 107-1.

A second planarization layer 107-2 is located on the first planarization layer 107-1. The planarization layer is implemented including two planarization layers due to an increase in the number of various signal lines as the display apparatus 100 is developed to a higher resolution. Therefore, it is difficult to place all lines in a single layer while ensuring a minimum gap between the lines. Thus, an additional layer is needed. This additional layer (the second planarization layer) provides sufficient room for the placement of lines, which makes it easier to design the placement of lines/electrodes. Further, if a dielectric material is used for the planarization layers 107-1 and 107-2, the planarization layers 107-1 and 107-2 may be used for forming a capacitance between the metal layers.

The organic light emitting diode may have a structure in which an anode electrode 112, an organic light emitting layer 114, and a cathode electrode 116 are sequentially disposed. That is, the organic light emitting diode may include the anode electrode 112 formed on the planarization layers 107-1 and 107-2, the organic light emitting layer 114 located on the anode electrode 112, and the cathode electrode 116 located on the organic light emitting layer 114.

The anode electrode 112 may be electrically connected to a drain electrode 108 of a driving thin film transistor through a connection electrode 108-2. When the organic light emitting display apparatus 100 is of a top-emission type, the anode electrode 112 may be made of an opaque conductive material having high reflectivity. For example, the anode electrode 112 may be made of silver (Ag), aluminum (Al), gold (Au), molybdenum (Mo), tungsten (W), chromium (Cr) or an alloy thereof. The connection electrode 108-2 may be made of the same material as the source and drain electrodes 106 and 108.

A bank 110 is formed in a region except for an emission region. Accordingly, the bank 110 has a bank hole for exposing the anode electrode 112 corresponding to the emission region. The bank 110 may be made of an inorganic insulating material, such as a silicon nitride (SiNx) film or a silicon oxide SiOx film, or an organic insulating material, such as BCB, acrylic-based resin and imide-based resin.

The organic light emitting layer 114 is disposed on the anode electrode 112 which is exposed by the bank 110. The organic light emitting layer 114 may include a light emitting layer, an electron injection layer, an electron transport layer, a hole transport layer, a hole injection layer and the like.

The cathode electrode 116 is disposed on the organic light emitting layer 114. When the organic light emitting display apparatus 100 is of a top-emission type, the cathode electrode 116 may be made of a transparent conductive material, such as indium tin oxide (ITO), indium zinc oxide (IZO), or the like. Thus, light generated from the organic light emitting layer 114 is emitted to an upper portion of the cathode electrode 116.

An encapsulation layer 120 is located on the cathode electrode 116. The encapsulation layer 120 blocks the permeation of oxygen and moisture from the outside to suppress oxidation of the light emitting material and the electrode material. When the organic light emitting diode is exposed to moisture or oxygen, a pixel shrinkage in which the emission region is reduced may occur or dark spots may appear in the emission region. The encapsulation layer may be formed as an inorganic film made of glass, metal, aluminum oxide (AlOx) or silicon (Si)-based material. Alternatively, the encapsulation layer may have a structure in which an organic film and an inorganic film are alternately laminated. The inorganic film serves to block the permeation of moisture or oxygen, and the organic film serves to planarize the surface of the inorganic film. The reason why the encapsulation layer is formed by a plurality of thin film layers is to make a permeation path of moisture and oxygen longer and more complicated than a single layer, which makes the permeation of moisture/oxygen into the organic light emitting diode difficult.

Specifically, the encapsulation layer 120 may include a first inorganic insulating film 121, an organic insulating film 122 and a second inorganic insulating film 123. The first inorganic insulating film 121, the organic insulating film 122 and the second inorganic insulating film 123 may be sequentially disposed.

The barrier film 140 is disposed on the encapsulation layer 120 to encapsulate the entire substrate 101 including the organic light emitting diode. The barrier film 140 may be a phase difference film or an optically isotropic film. When the barrier film has optically isotropic characteristics, light incident into the barrier film is transmitted as it is without phase delay. Further, an organic film or an inorganic film may be further disposed on an upper or lower surface of the barrier film. The organic film or the inorganic film formed on the upper or lower surface of the barrier film serves to block the permeation of moisture or oxygen from the outside.

An adhesive layer 145 may be located between the barrier film 140 and the encapsulation layer 120. The adhesive layer 145 bonds the encapsulation layer 120 and the barrier film 140. The adhesive layer 145 may be a heat-curable or naturally curable adhesive. For example, the adhesive layer 145 may be made of a material such as barrier pressure sensitive adhesive (B-PSA). A touch panel (film), a polarizing film, a top cover and the like may be further disposed on the barrier film 140.

Figure 3A:
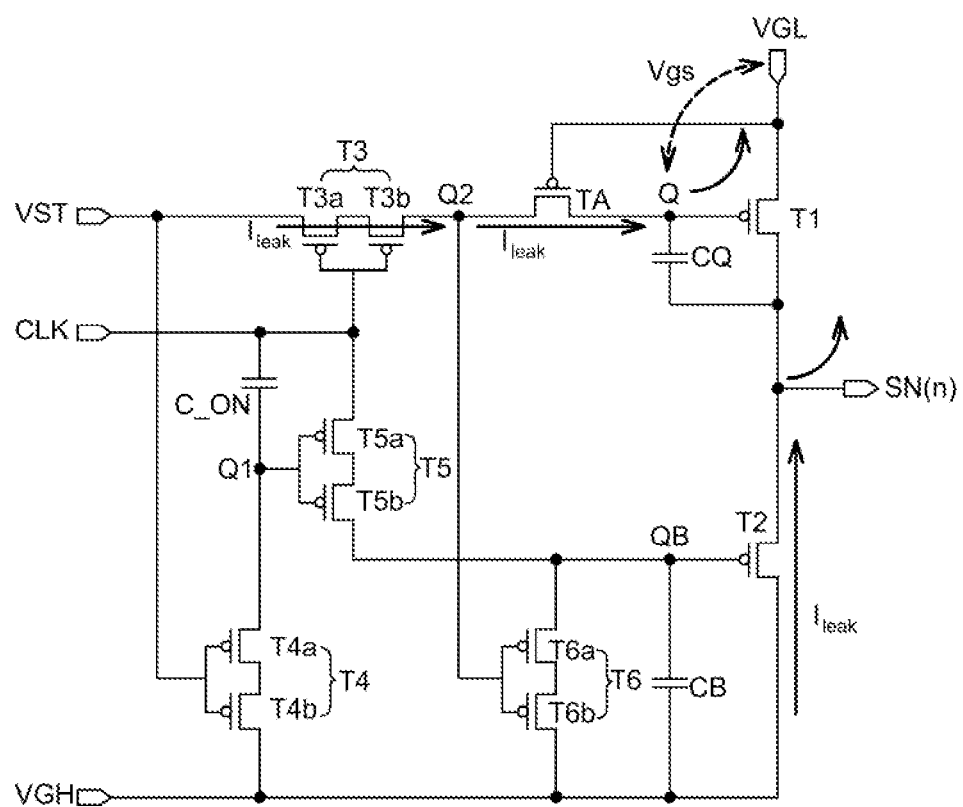
FIG. 3A is a circuit diagram illustrating a circuit configuration of a gate driver.

FIG. 3A illustrates the configuration of a gate driver applied to the display apparatus.

Referring to FIG. 3A, the GIP outputs an output signal SN(n) of a gate high voltage VGH while a node Q2 is deactivated to the gate high voltage VGH and a node QB is activated to a gate low voltage VGL. Then, the GIP outputs an output signal SN(n) of the gate low voltage VGL while the node Q2 is activated to the gate low voltage VGL and the node QB is deactivated to the gate high voltage VGH. In other words, the GIP outputs the output signal SN(n) of the gate low voltage VGL from when the node Q is bootstrapped in synchronization with a timing when the node Q2 is activated.

To this end, the GIP may include a Q2 controller, a QB controller, an output unit and a first stabilization unit.

The Q2 controller may be implemented with a transistor T3. The transistor T3 activates the node Q2 by applying a start signal VST of the gate low voltage VGL to the node Q2 in response to a clock signal CLK. A gate electrode of the transistor T3 is connected to an input terminal of the clock signal CLK. A first electrode and a second electrode of the transistor T3 are connected to an input terminal of the start signal VST and the node Q2, respectively.

The QB controller activates the node QB as opposed to the node Q2 in response to the clock signal CLK, the start signal VST and a potential of the node Q2. The QB controller may be implemented with a capacitor C_ON, a transistor T5, a transistor T4, a transistor T6 and a capacitor CB.

The capacitor C_ON is connected between the input terminal of the clock signal CLK and a node Q1. The transistor T5 supplies the clock signal CLK to the node QB according to a potential of the node Q1. A gate electrode of the transistor T5 is connected to the node Q1, and a first electrode and a second electrode of the transistor T5 are connected to the input terminal of the clock signal CLK and the node QB, respectively. The transistor T4 supplies the gate high voltage VGH to the node Q1 in response to the start signal VST. A gate electrode of the transistor T4 is connected to the input terminal of the start signal VST, and a first electrode and a second electrode of the transistor T4 are connected to the node Q1 and an input terminal of the gate high voltage VGH, respectively. With this configuration, the potential of the node Q1 changes in synchronization with the clock signal CLK while the start signal VST is held at the gate high voltage VGH. Also, the potential of the node Q1 has the gate high voltage VGH while the start signal VST is held at the gate low voltage VGL.

The transistor T6 supplies the gate high voltage VGH to the node QB according to the potential of the node Q2. A gate electrode of the transistor T6 is connected to the node Q2, and a first electrode and a second electrode of the transistor T6 are connected to the node QB and the input terminal of the gate high voltage VGH, respectively. The capacitor CB is connected between the node QB and the gate high voltage VGH to stabilize a potential of the node QB.

The output unit includes a transistor T1 serving as a pull-down element, a transistor T2 serving as a pull-up element and a capacitor CQ.

The transistor T1 supplies an output signal SN(n) of the gate low voltage VGL to an output node from when the node Q is bootstrapped in synchronization with a timing when the node Q2 is activated. A gate electrode of the transistor T1 is connected to the node Q, and a first electrode and a second electrode of the transistor T1 are connected to an input terminal of the gate low voltage VGL and the output node, respectively. The capacitor CQ is connected between the node Q and the output node. When the output signal SN(n) changes from the gate high voltage VGH to the gate low voltage VGL, the capacitor CQ reflects a change in potential of the output node to a potential of the node Q. Thus, the capacitor CQ functions to bootstrap the node Q. The transistor T2 supplies the output signal SN(n) of the gate high voltage VGH to the output node while the node QB is activated prior to the node Q2. A gate electrode of the transistor T2 is connected to the node QB, and a first electrode and a second electrode of the transistor T2 are connected to the output node and the input terminal of the gate high voltage VGH, respectively.

The first stabilization unit may be implemented with a transistor TA. A gate electrode of the transistor TA is connected to the input terminal of the gate low voltage VGL, and a first electrode and a second electrode of the transistor TA are connected to the node Q2 and the node Q, respectively. When the node Q is bootstrapped, a channel current between the first electrode and the second electrode of the transistor TA becomes zero. In other words, when the node Q is bootstrapped, the transistor TA is turned off and thus blocks an electrical connection between the node Q2 and the node Q. While the node Q is not bootstrapped, the transistor TA maintains a turn-on state.

The transistor TA maintains the turn-on state and is turned off only when the node Q is bootstrapped. Thus, the transistor TA blocks a current flow between the node Q2 and the node Q. Therefore, when the node Q is bootstrapped, the potential of the node Q2 becomes different from the potential of the node Q. Even when the potential of the node Q changes at the moment when the node Q is bootstrapped, the potential of the node Q2 does not change. Therefore, the transistors T3 and T6 connected to the node Q2 are not overloaded at the moment when the node Q is bootstrapped. If there is no transistor TA, a drain-to-source voltage of the transistor T3 and a gate-to-source voltage Vgs of the transistor T6 may increase to a voltage level equal to or greater than a critical value due to the bootstrapping. If such an overload phenomenon continues, an element breakdown phenomenon, so-called, a breakdown phenomenon may occur. The transistor TA may suppress breakdown of the transistors T3 and T6 connected to the node Q2 at the moment when the node Q is bootstrapped.

As for the transistor T2 shown in FIG. 3A, if a drain-to-source voltage VGH-VGL is high when the potential of the output node is held at the gate low voltage VGL and this state lasts for a long time, the transistor T2 may be easily degraded. If a leakage current Ileak flows in the transistor T2 due to the degradation, a normal output signal SN(n) may not be output.

Figure 3B:
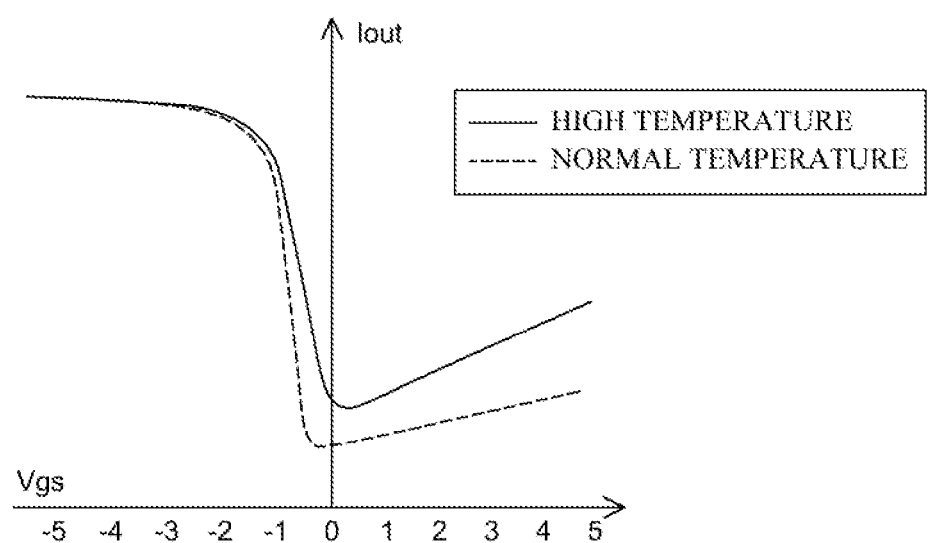
FIG. 3B is a voltage-current graph showing changes in output from a transistor depending on temperature change.

FIG. 3B is a graph showing changes in output from a transistor between normal temperature and high temperature in connection with FIG. 3A. Referring to FIG. 3B, a voltage and an output current Iout depending on the temperature of a transistor may be seen. The X-axis of the graph represents a gate-to-source voltage Vgs, and there is no difference in output current value between normal temperature and high temperature at about −2 V or less. However, a difference in output current value may be made when the voltage changes to positive from about −1 V. Referring to FIG. 3B, when the gate-to-source voltage Vgs is 0 V, there is a difference in output current values of the transistors between normal temperature and high temperature. It may be seen that a current output at a higher temperature is higher. When the display apparatus 100 is in a high temperature environment, a leakage current of the GIP may increase.

Figure 3C:
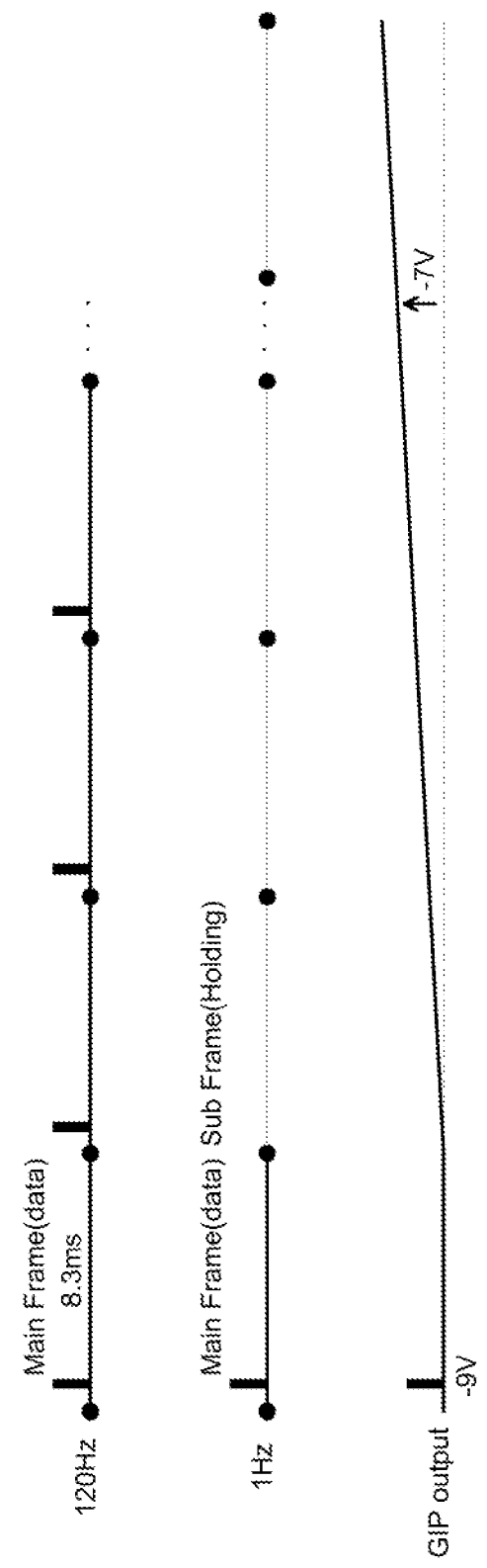
FIG. 3C is a conceptual diagram illustrating a frame configuration for each driving speed of a gate driver and a change in output from the gate driver at that time.

FIG. 3C illustrates a frame during high-speed driving and low-speed driving and an output from the GIP during low-speed driving.

High-speed driving and low-speed driving may be applied together to the display apparatus 100, and the display apparatus 100 may achieve reduction in power consumption during low-speed driving. Referring to FIG. 3C, during 120 Hz high-speed driving, a main frame is refreshed about every 8.3 ms to be normally operated. Here, an output voltage of the GIP may be about −9 V. During 1 Hz low-speed driving, the main frame needs to be refreshed every 1 second. Therefore, an output value of the main frame needs to be held in a subframe period after about 8.3 ms when the main frame outputs. As a holding time increases, an output value of the GIP may increase. The GIP may output an increased voltage of about −7 V or more in the subframe period.

Referring to FIG. 3A through FIG. 3C, this phenomenon may easily occur at a high temperature. In the configuration diagram of the GIP shown in FIG. 3A, a leakage current flowing from the transistor T3 to the transistor T1 and the node Q causes an increase in potential of the node Q2. When an output of the transistor T1 decreases, the leakage current is output through the transistor T2.

Figure 4A:
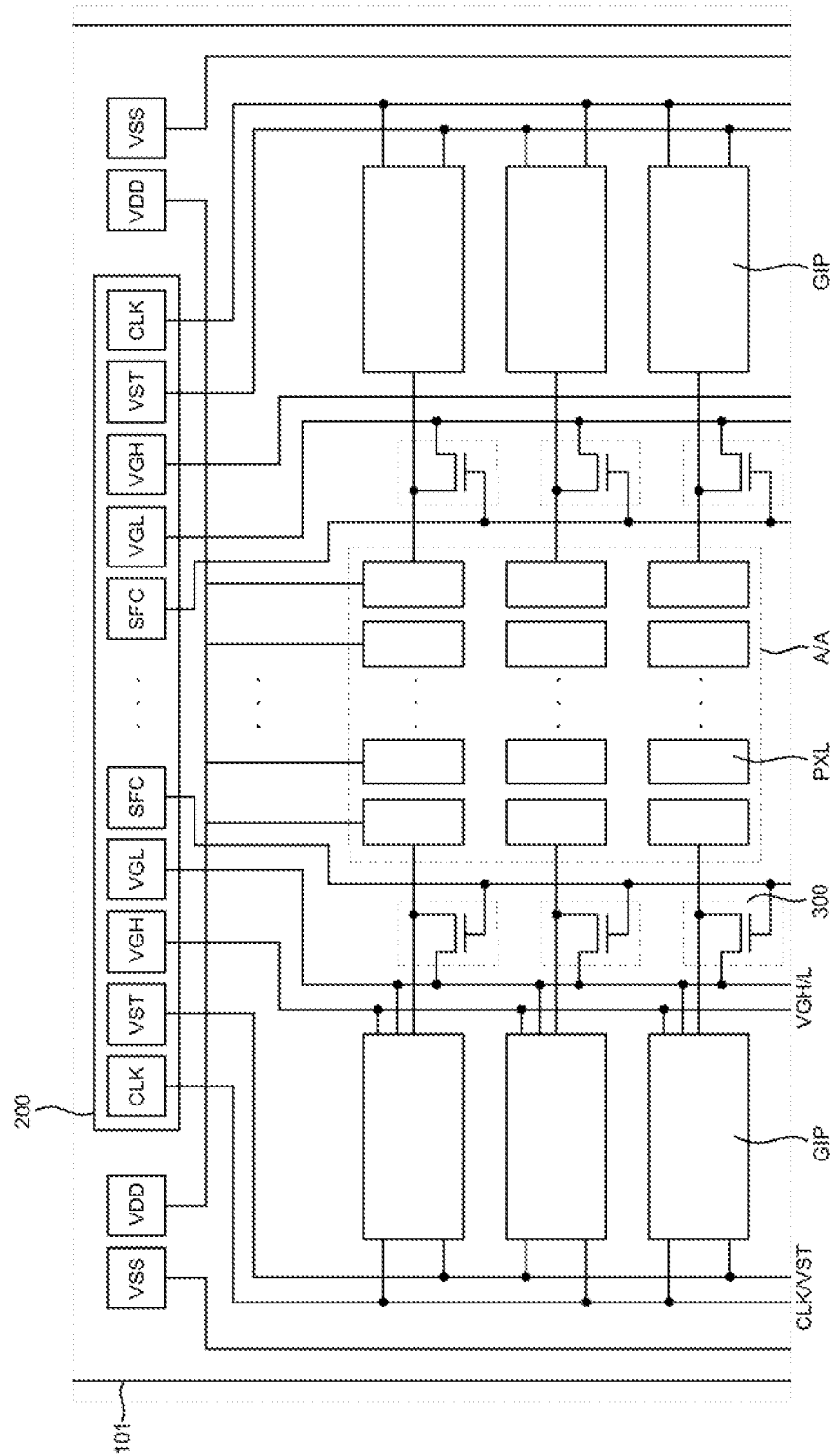
FIG. 4A shows the configuration of an active area and an inactive area according to the present exemplary aspect in the display panel shown in FIG. 1.

FIG. 4A illustrates characteristics of the display apparatus of FIG. 1 in connection with the exemplary aspects of the present disclosure. Referring to FIG. 4A, a driver IC 200 may be disposed on an upper side of the substrate 101, and a pad for low-potential power VSS and a pad for high-potential power VDD may be disposed on left and right sides of the driver IC. In a region for the driver IC 200, pads for signals controlling the GIP may be disposed. Specifically, the pads for the clock signal CLK, the start signal VST, the gate high voltage VGH and the gate low voltage VGL may be disposed. Lines extended from the pads for the clock signal CLK, the start signal VST, the gate high voltage VGH and the gate low voltage VGL may be connected to the GIP. The GIP may generate emission signals, scan signals, and the like required for the pixel circuits in the active area A/A.

Referring to FIG. 4A, a subframe control pad SFC for a subframe controller 300 may be further disposed in the region for the driver IC 200 to implement the exemplary aspects of the present disclosure. The subframe controller 300 may be disposed between the GIP and the pixel PXL in the active area A/A. A gate electrode of the subframe controller 300 may be connected to the subframe control pad SFC and a source electrode may be connected to the gate low voltage VGL. A drain electrode of the subframe controller 300 may be connected to a line extended from the GIP to the pixel PXL in the active area A/A. In an example, the drain electrode of the subframe controller may be electrically connected to an output terminal of the GIP, and the output terminal of the GIP may be connected to the pixel PXL. A source electrode of the subframe controller 300 may be connected to the pad for the gate low voltage VGL. For the subframe controller 300, the driver IC 200 adds a signal to output a signal to the subframe control pad SFC at the moment when the main frame is ended and the subframe is started. Thus, the subframe controller 300 may be turned on. When the subframe controller 300 is turned on, a voltage of the gate low voltage VGL may be applied to an output signal of the GIP. A voltage of about −9 V is continuously applied to the gate low voltage VGL. When the gate low voltage VGL is applied to the output signal of the GIP through the turned-on subframe controller 300, an increase in output of the GIP in the subframe period may be minimized.

FIG. 4B is a graph showing an output value of the GIP according to the exemplary aspect shown in FIG. 4A.

Referring to FIG. 4B, during 1 Hz low-speed driving, the subframe controller 300 may be turned on at the moment when the subframe period, in which an output of the GIP needs to be held, starts after 8.3 ms which is the main frame period. That is, the subframe controller 300 may be in a turn-off state during a main frame period of the pixel and in a turn-on state during a subframe period of the pixel. When the subframe controller 300 is changed from a turn-off state to a turn-on state, −9 V of the gate low voltage VGL is applied to an output terminal of the GIP, and, thus, an increase in output of the GIP shown in FIG. 3C may be minimized. Therefore, it is possible to suppress abnormal display caused by an abnormal output of the GIP.

The display apparatus according to the exemplary aspects of the present disclosure may include a liquid crystal display apparatus LCD, a field emission display apparatus FED, an organic light emitting diode OLED display apparatus and a quantum dot display apparatus.

The display apparatus according to the exemplary aspects of the present disclosure may also include equipment display apparatus including complete product or final product of LCM, OLED or QD module, for example, notebook computer, television, computer monitor, automotive display apparatus, or other vehicle display apparatuses, and set electronic devices or set device (set apparatus) such as mobile electronic devices of smart phone or electronic pad.

The exemplary aspects of the present disclosure may also be described as follows:

According to an aspect of the present disclosure, there is provided a display apparatus. The display apparatus includes an active area. The display apparatus further includes an inactive area surrounding the active area. The display apparatus further includes a pixel disposed in the active area. The display apparatus further includes a driver IC, a gate driver, a low-potential power line, a high-potential power line and a subframe controller disposed in the inactive area. The subframe controller is disposed between the pixel and the gate driver.

The driver IC may include a subframe control pad connected to a gate electrode of the subframe controller.

The driver IC may include a gate low voltage pad and a gate high voltage pad connected to the gate driver. The gate low voltage pad may be connected to a source electrode of the subframe controller.

The gate low voltage may be −9 V.

The gate driver may include an oxide transistor.

A drain electrode of the subframe controller may be electrically connected to an output terminal of the gate driver, and the output terminal of the gate driver may be connected to the pixel.

The gate driver may be driven in a 1 Hz low-speed driving mode.

The subframe controller may be in a turn-off state during a main frame period of the pixel and in a turn-on state during a subframe period of the pixel.

When the subframe controller is in a turn-on state, a drain electrode of the subframe controller may output an output voltage of −9 V.

According to another aspect of the present disclosure, there is provided a display apparatus. The display apparatus includes an active area. The display apparatus further includes an inactive area surrounding the active area. The display apparatus further includes a pixel disposed in the active area. The display apparatus further includes a driver IC, a gate driver, a low-potential power line, a high-potential power line and a subframe controller disposed in the inactive area. The gate driver is driven in a low-speed driving mode.

The gate driver may include an oxide transistor.

The subframe controller may be disposed between the pixel and the gate driver.

The driver IC may include a subframe control pad connected to a gate electrode of the subframe controller.

The driver IC may include a gate low voltage pad and a gate high voltage pad connected to the gate driver, and the gate low voltage pad may be connected to a source electrode of the subframe controller.

The gate low voltage may be −9 V.

The subframe controller may be in a turn-off state during a main frame period of the pixel and in a turn-on state during a subframe period of the pixel.

When the subframe controller is in a turn-on state, a drain electrode of the subframe controller may output an output voltage of −9 V.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
a substrate;
a driver IC disposed on a side of the substrate; and
a gate driver disposed on a side of the substrate;
a pad for low-potential power disposed on a left side and a right side of the driver IC; and
a pad for high-potential power disposed on the left side and the right side of the driver IC,
wherein the gate driver includes:
   a transistor T1 including a gate electrode electrically connected to a node Q and a capacitor CQ, and electrically connected between an input terminal of a gate low voltage and an output node;
   a transistor T2 including a gate electrode electrically connected to a node QB and electrically connected between an input terminal of a gate high voltage and the output node;
   a capacitor CB electrically connected between the input terminal of the gate high voltage and the gate electrode of the transistor T2;
   a transistor T3 including a gate electrode electrically connected to an input terminal of a clock signal, and electrically connected between an input terminal of a start signal and the node Q;
   a transistor T4 electrically connected the input terminal of the gate high voltage;
   a transistor T5 electrically connected between the input terminal of the clock signal and the transistor T2;
   a transistor T6 electrically connected between the input terminal of the gate high voltage and the transistor T2; and
   a transistor TA electrically connected between the transistor T3 and the transistor T1.

2. The display apparatus according to claim 1, further comprising:
a low potential power line disposed on the left side and the right side of the driver IC; and
a high potential power line disposed on the left side and the right side of the driver IC and a lower side of the driver IC.

3. The display apparatus according to claim 2, wherein the high potential power line is disposed closer to the driver IC than the low potential power line on the left and right sides of the driver IC, respectively.

4. The display apparatus according to claim 1, wherein the clock signal is applied to the gate electrode of the transistor T2, and
wherein the start signal is applied to the gate electrode of the transistor T1.

5. The display apparatus according to claim 1, wherein the transistor T4 is connected between the input terminal of the gate high voltage and the input terminal of the clock signal.

6. The display apparatus according to claim 1, wherein the gate driver includes:

a Q2 controller including the transistor T3 and activating a node Q2 in response to the clock signal;
a QB controller activating the node QB as opposed to the node Q2 in response to the clock signal and including the transistor T5, the transistor T4, the transistor T6 and the capacitor CB;
an output unit including the transistor T1 serving as a pull-down element, the transistor T2 serving as a pull-up element and the capacitor CQ; and
a stabilization unit including the transistor TA and blocking an electrical connection between the node Q2 and the node Q when the node Q is bootstrapped.

7. The display apparatus according to claim 1, wherein a first electrode of the transistor T3 is connected to the input terminal of the start signal,
wherein a second electrode of the transistor T3 is connected to a first electrode of the transistor TA, and
wherein a second electrode of the transistor TA is connected to the gate electrode of the transistor T1.

8. The display apparatus according to claim 1, wherein the gate driver includes an oxide transistor.

9. The display apparatus according to claim 1, further comprising: a pixel circuit including an oxide transistor on the substrate.

10. The display apparatus according to claim 1, wherein the gate driver is driven at a scanning rate of less than 60 Hz.

11. The display apparatus according to claim 1, further comprising:
a pixel disposed in an active area on the substrate; and
a subframe controller disposed on a side of the substrate,
wherein the subframe controller is disposed between the pixel and the gate driver,
wherein the driver IC includes a gate low voltage pad connected to the gate driver, and
wherein the gate low voltage pad is connected to a source electrode of the subframe controller.

12. The display apparatus according to claim 11, wherein the driver IC includes:
a subframe control pad connected to a gate electrode of the subframe controller; and
a clock signal pad, a start signal pad and a gate high voltage pad connected to the gate driver.

13. The display apparatus according to claim 11, wherein the driver IC includes a gate high voltage pad connected to the gate driver.

14. The display apparatus according to claim 11, wherein a drain electrode of the subframe controller is electrically connected to an output terminal of the gate driver, and the output terminal of the gate driver is connected to the pixel.

15. The display apparatus according to claim 11, wherein the subframe controller is in a turn-off state during a main frame period of the pixel and is in a turn-on state during a subframe period of the pixel.

16. The display apparatus according to claim 15, wherein a drain electrode of the subframe controller outputs an output voltage of −9 V when the subframe controller is in the turn-on state.

17. The display apparatus according to claim 11, wherein a drain electrode of the subframe controller is connected to a line extended from the gate driver to the pixel.

* * * * *